(12) United States Patent
Chen et al.

(10) Patent No.: US 6,888,863 B1
(45) Date of Patent: May 3, 2005

(54) SYSTEM COMPRISING OPTICAL SEMICONDUCTOR WAVEGUIDE DEVICE

(75) Inventors: Yongqin Chen, Holmdel, NJ (US); William Larry Wilson, Somerville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 261 days.

(21) Appl. No.: 09/608,639

(22) Filed: Jun. 30, 2000

(51) Int. Cl.[7] .................................................. H01S 5/00
(52) U.S. Cl. .......................... 372/43; 372/32; 372/45; 372/102
(58) Field of Search ............................. 372/6, 32, 43, 372/45, 102

(56) References Cited

U.S. PATENT DOCUMENTS

| | | | |
|---|---|---|---|
| 5,077,816 A | 12/1991 | Glomb et al. ................. 385/37 |
| 5,459,799 A | 10/1995 | Weber ............................. 385/2 |
| 5,574,742 A | 11/1996 | Ben-Michael et al. | |
| 5,651,018 A | 7/1997 | Mehuys et al. ............... 372/50 |
| 5,710,650 A | * 1/1998 | Dugan ......................... 359/133 |
| 5,715,263 A | * 2/1998 | Ventrudo ....................... 372/6 |
| 5,780,875 A | * 7/1998 | Tsuji ............................ 257/81 |
| 5,870,417 A | 2/1999 | Verdiell et al. ............... 372/32 |
| 5,930,423 A | 7/1999 | Chen et al. ................... 385/49 |
| 5,936,980 A | 8/1999 | Espindola et al. ............. 372/6 |
| 5,943,352 A | 8/1999 | Fee .............................. 372/32 |
| 5,978,400 A | * 11/1999 | Campbell ...................... 372/46 |
| 6,041,072 A | 3/2000 | Ventrudo et al. ........... 372/102 |
| 6,058,131 A | 5/2000 | Pan ............................. 372/102 |
| 6,091,744 A | 7/2000 | Sorin et al. .................. 370/20 |
| 6,101,210 A | 8/2000 | Bestwick et al. ............. 372/96 |
| 6,125,222 A | 9/2000 | Anthon ........................ 385/33 |
| 6,195,485 B1 | * 2/2001 | Coldren ....................... 385/49 |

FOREIGN PATENT DOCUMENTS

EP 0 812 040 10/1997 ........... H01S/3/085

OTHER PUBLICATIONS

Al–Salameh, D.Y. *Bell Labs Technical Journal*, "Optical Networking", pp. 39–61, Jan.–Mar. 1998.
Giles, C.R. *Bell Labs Technical Journal*, "Wavelength Add/Drop Multiplexer for Lightwave Communication Networks", pp. 207–229, Jan.–Mar. 1999.
Sun, Y. *Bells Labs Technical Journal*, "Optical Fiber Amplifiers for WDM Optical Networks", pp. 187–206, Jan.–Mar. 1999.
Refi, J.J. *Bell Labs Technical Journal*, "Optical Fibers for Optical Networking", pp. 246–261, Jan.–Mar. 1999.

* cited by examiner

*Primary Examiner*—Don Wong
*Assistant Examiner*—Cornelius H Jackson

(57) ABSTRACT

An improved optical communication system is provided, the system particularly suited for so-called short-haul applications, e.g., applications involving transmission over distances less than 100 km, such as metro applications. The system uses an external cavity laser made up of a gain medium that comprises an active region, a beam expanding region, and an antireflective layer, an optical waveguide located adjacent the gain medium, and a Bragg grating integral with or coupled to the optical waveguide. The medium and the optical waveguide, due to the beam expanding region, exhibit a coupling efficiency of at least 40%, advantageously at least 50%, even in the absence of coupling optics, and the laser is configured and operated to emit at least two modes.

21 Claims, 6 Drawing Sheets

SYSTEM COMPRISING OPTICAL SEMICONDUCTOR WAVEGUIDE DEVICE

BACKGROUND OF THE INVENTION

1. Field of the Invention

The invention relates to laser devices useful in optical communications systems, particularly wavelength division multiplexing systems.

2. Discussion of the Related Art

As the use of optical communications continues to increase, the techniques for wavelength generation, selection, and maintenance have become more important. This is particularly the case for wavelength division multiplexing (WDM), in which precise and stable alignment of the source wavelength to a channel of the WDM system is necessary. However, because the emission wavelength of diode lasers tends to vary in response to temperature changes, various measures have been developed in an effort to stabilize emission of the desired source wavelength. One such measure is use of a fiber Bragg grating coupled to a semiconductor laser, where the laser is operated only a gain medium and the grating constitutes one reflective facet of the laser. This device is therefore typically referred to as an external cavity laser. The grating generally reflects only a selected wavelength such that the device lases only at the wavelength. Such an apparatus makes it possible to better ensure that the desired wavelength is emitted.

However, even these Bragg grating devices encounter a variety of stability issues, including thermal stability problems such as a mismatch between the thermal response of the diode versus the Bragg grating. These can significantly interfere with the operation of the laser, particularly where single mode output is desired. See, for example, U.S. Pat. No. 5,870,417 to Verdiell et al. (at Col. 2, lines 20–36). In response to these stability problems, Verdiell et al. present numerous—but complex—techniques that attempt to avoid or at least compensate for factors that lead to instability in the output wavelength of laser diode/grating devices, e.g., mode hopping. Simpler, and more commercially feasible, techniques would be preferred.

A separate problem in optical communications is coupling a semiconductor device (e.g., a diode) to a communications fiber—this coupling is difficult and problematic. For example, a very small displacement of the fiber relative to the semiconductor device output can lead to loss of more than half the light directed at the fiber. For this reason, coupling is typically performed by providing coupling optics between the fiber and the device. These optics can take many forms, including a tapered or conical lens formed or spliced onto the fiber, or a variety of other lens configurations. (Again, see Verdiell et al., supra, at Col. 4, lines 23–54.) Such coupling optics, however, add more complexity, both to the device as well as the overall packaging scheme. And, more significantly, even with these optics, precise alignment is still required.

Thus, improved techniques for overcoming these problems are desired.

SUMMARY OF THE INVENTION

The invention provides an improved optical communication system, particularly suited for so-called short-haul applications, e.g., applications involving transmission over distances less than 100 km, such as metro applications. The system uses an external cavity laser made up of a gain medium that comprises an active region, a beam expanding region, and an antireflective layer, an optical waveguide located adjacent the gain medium, and a Bragg grating integral with or coupled to the optical waveguide. The medium and the optical waveguide, due to the beam expanding region, exhibit a coupling efficiency of at least 40%, advantageously at least 50%, even in the absence of coupling optics, and the laser is configured and operated to emit at least two modes. The system's several advantages and distinctions over existing external cavity laser systems include the following.

First, existing external cavity systems must employ complex temperature compensating apparatus to maintain single mode operation in the face of potential mode-hopping, as discussed in Verdiell et al., supra. By contrast, the laser of the invention avoids the need for such temperature compensation by configuring a short-cavity external cavity laser for multimode operation, generally by selecting a Bragg grating of sufficiently wide bandwidth. It was discovered that multimode operation—2 to 3 modes is typical—reduce the noise associated with temperature-induced mode-hopping, and thereby provide a more robust, temperature-independent system, with no need for complex temperature compensation. In fact, without any temperature compensation, bit error rates in the system are leas than $10^{-9}$, advantageously less than $10^{-12}$. (This bit error rate includes a situation, for example, in which a transmitter of a system exhibits a bit error rate greater than $10^{-9}$ which is corrected to less than $10^{-9}$ by other hardware or software of the system, e.g., forward error correcting code.) And multimode emission is generally acceptable for short-haul applications, including short-haul applications employing WDM or dense WDM (DWDM).

Second, as discussed above, the process of coupling a gain medium to a fiber tends to be complex and difficult. The gain medium of the invention's external cavity, however, contains a beam expanding region, which allows attainment of a high coupling efficiency (at least 50%) between the medium and the optical waveguide, without the coupling optics that are conventionally used. For example, this high coupling efficiency is attainable even with nothing more than a small air gap between the gain medium and optical waveguide.

Third, because complex and precise coupling optics are not required, packaging of the external cavity laser is relatively cheap and easy. For example, an optical fiber can simply be secured in a v-groove adjacent the gain medium.

Thus, the system of the invention is not only more robust and temperature independent than existing systems, but is also simpler and less expensive to package.

DETAILED DESCRIPTION OF THE INVENTION

Figure 1A:
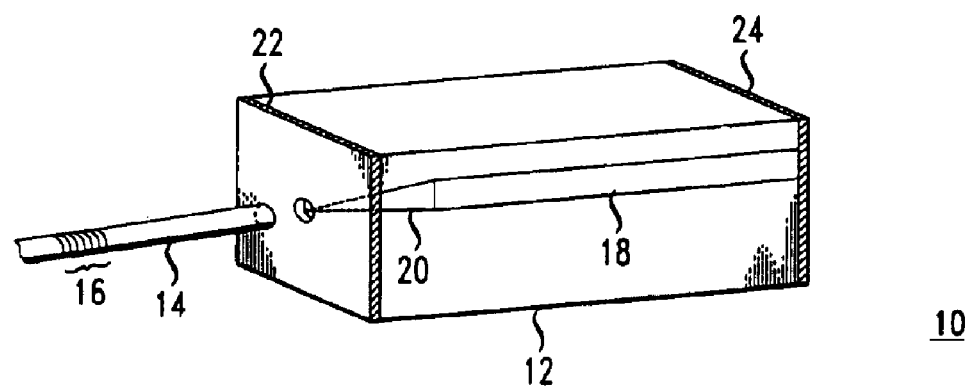
FIGS. 1A and 1B show an embodiment of an external cavity laser of the system of the invention.
Figure 1B:
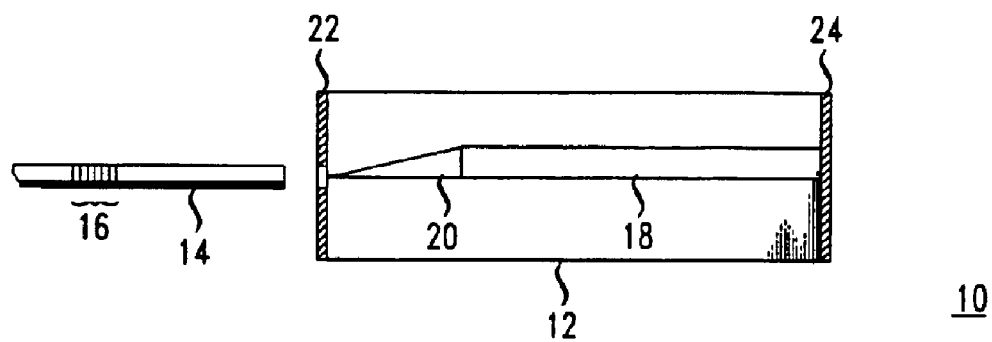

In one embodiment, the laser of the communication system of the invention contains three basic elements, as reflected in FIGS. 1A and 1B—a gain medium 12, an optical waveguide 14, and a Bragg grating 16 integral with or coupled to the waveguide 14.

The gain medium 12 contains an active region 18, a beam expander region 20, and an antireflective layer 22 at the surface of the medium 12 adjacent the waveguide 14. One gain medium suitable for the invention is of the type disclosed in co-assigned U.S. Pat. No. 5,574,742 to Ben-Michael et al., the disclosure of which is hereby incorporated by reference. Other suitable configurations are disclosed in co-assigned U.S. patent applications Ser. No. 09/378,032 filed Aug. 20, 1999 (our reference Eng 4-5-1-1-3) Ser. No. 09/228,218 filed Jan. 11, 1999 (our reference Johnson 6-19-8-1-3), and Ser. No. 09/561,148 filed Apr. 28, 2000 (our reference Alam 3-6-9-9-10-59), the disclosures of which are hereby incorporated by reference. A short-cavity gain medium, i.e., having a cavity length less than 1 cm is typically suitable.

Figure 2A:
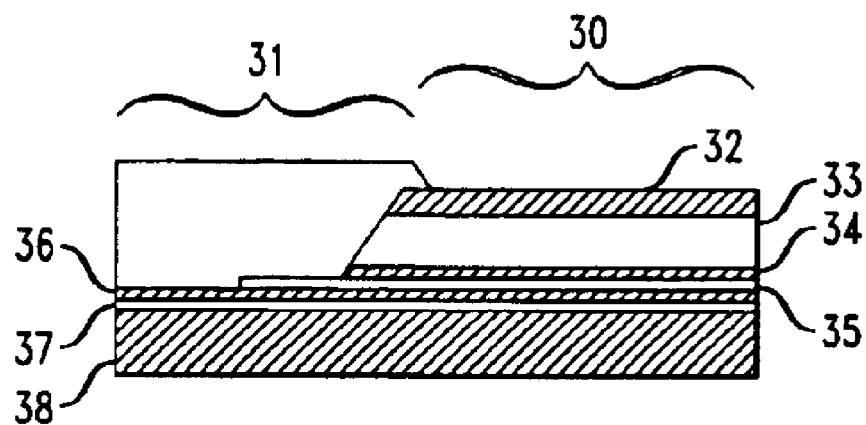
FIGS. 2A and 2B show an embodiment of a beam expanding region of an external cavity laser of the system of the invention.
Figure 2B:
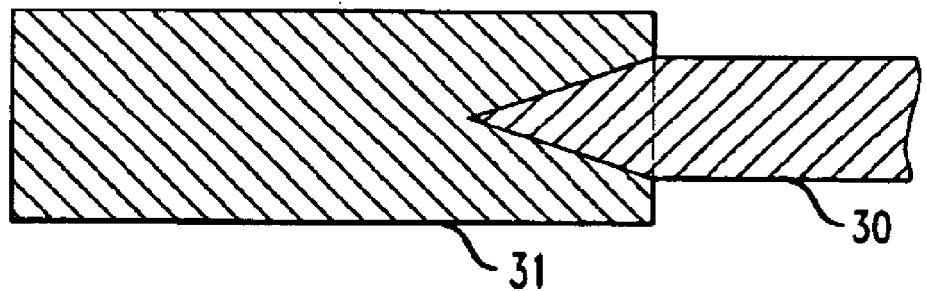

FIGS. 2A and 2B show an embodiment of an active region 30 and beam expander region 31 suitable for use in the invention. As shown in the side view of FIG. 2A, the active region, e.g., a diode laser or optical amplifier, contains a quantum well 33 that generates light when excited or pumped by electrical current. An upper cladding layer 32 is formed over the quantum well 33. Upper and lower guiding layers 35 and 37 are located below the well 33, along with a bottom cladding layer 38. Etch stop layers, illustrated by layers 34 and 36 in FIG. 2A, are typically present to assist the fabrication process. FIG. 2B shows a top view of the active region 30 and beam expander region 31. Variations on this structure are possible. A useful material for the guiding layers 35, 37 is indium gallium arsenide phosphite (InGaAsP), although a variety of other compound semiconductors, e.g., Group III–IV materials, are also possible. When InGaAsP is used, the etch stop layers are typically formed from indium phosphite (InP), which is highly resistant to etchants that are useful with the InGaAsP. The overall structure is capable of being formed by techniques such as molecular beam epitaxy, vapor phase epitaxy, or metal organic chemical vapor deposition (MOCVD), as discussed in the references cited above.

The beam expanding region 31 expands the size of a beam generated by the active region 30 in two possible ways. First, lateral broadening is possible by making the beam expanding region 31 wider than the active region, as reflected in FIG. 2B. Second, vertical broadening is achieved by the change from two guiding layers 35, 37 to a single guiding layer 37, as the light travels toward the end of the beam expanding region 31. The beam expansion makes coupling of the light beam to an adjacent optical waveguide less problematic, in that misalignment will have a much less significant effect on the coupling efficiency compared to conventional devices.

As shown in FIGS. 1A and 1B, the gain medium 10 also contains an antireflective layer 22. The layer 22 prevents the laser chips from lasing off the facets, i.e., prevents Fabry-Perot operation, and thereby makes the gain medium simply an amplifier. The antireflective layer also reduces reflection of the beam as the beam enters the optical waveguide 14. The waveguide is typically an optical fiber, although other waveguides, e.g., planar waveguides, are also possible. The waveguide is placed adjacent to the gain medium, such that the light beam is directed from the beam expanding region, through the antireflective layer, and into the waveguide. As noted above, by using the beam expanding region, it is possible to avoid any coupling optics, e.g., the beam can simply be directed into the polished end of the waveguide, and yet attain high coupling efficiencies, typically at least 40%, advantageously at least 50%. For example, it is possible to simply place or glue an optical fiber into a v-groove adjacent the gain medium. Various other coupling arrangements are suitable. It is also possible to place some index-matching material between the fiber and the gain medium to further reduce reflection and thereby enhance the coupling efficiency.

Once the light enters the waveguide 14, the light is directed to a Bragg grating 16. Typically, the optical waveguide is a fiber, and the Bragg grating is formed in the fiber (i.e., is integral with the fiber), but alternative embodiments are possible, e.g., a planar waveguide having a Bragg grating formed therein, or a waveguide coupled to a separately-formed Bragg grating. The Bragg grating 16 reflects a selected wavelength back toward the grain medium 12, and, due to the presence of a highly reflective layer 24 at the far end of the gain medium, lasing occurs at that selected wavelength. Additional wavelength filters are therefore not needed.

The laser is generally operated at wavelengths ranging from 1.2 to 1.6 $\mu$m, which are of primary interest in short-haul applications. Other wavelengths are also possible, however. The gain medium is generally operated by direct modulation, in which the current provided to the medium induces the desired bit rate. Typical bit rates for the system range from 100 MHz to 10 GHz.

The Bragg grating, whether integral with the waveguide or coupled thereto is selected to provide a laser emission of at least two modes, generally several adjacent modes. As discussed above, multimode emission is important to attainment of desirable properties in the overall system. Specifically, complex temperature-compensation apparatus is generally required to maintain a single mode emission, in order to avoid mode-hopping. Multimode emission, however, encounters much less noise due to mode-hopping, and thus allows operation of the external cavity laser without such complex temperature compensation. Specifically, the power fluctuations that occur with power transfers from one mode to another are substantially lessened, relative to single mode operation, because several modes are always lasing, i.e., the average or total power stays constant with the relative power between mode changes. In fact, using this multimode operation, it is possible to achieve a bit error rate of less than $10^{-9}$, advantageously less than $10^{-12}$, when operating the gain medium without temperature compensation. e.g., at about 2.5 GHz. And the multimode emission is generally suitable for transmission over distances less than 100 km.

A variety of Bragg grating configurations, known in the art, are possible, e.g., chirped gratings or apodized gratings. Selection of a grating that provides sufficient bandwidth for emission of at least two modes, e.g., a few modes, is within the skill of an ordinary artisan, as is reflected, for example, in Example 1 below, and such gratings are readily available commercially.

The system of the invention useful in a variety of applications. As noted above, the system is particularly useful for short-haul metro applications.

The invention will be further clarified by the following examples, which are intended to be exemplary.

Experimental

Gain media having a cavity length of about 250 $\mu$m and containing a beam expanding region of the type discussed above were provided, and configured for direct modulation. The media had a highly reflective coating on the rear facet and an anti-reflective coating having a reflectivity less than $10^{-4}$ on the front facet. The gain media were mounted on test studs and butt-coupled to fiber Bragg gratings, with an air gap of about 5 $\mu$m. The output of these external cavity devices was measured using a Rifocs 578L power meter and characterized using a Hewlett-Packard 7951B optical spectrum analyzer. RF response was measured with a Hewlett-Packard 8593E spectrum analyzer.

EXAMPLE 1

Figure 3A:
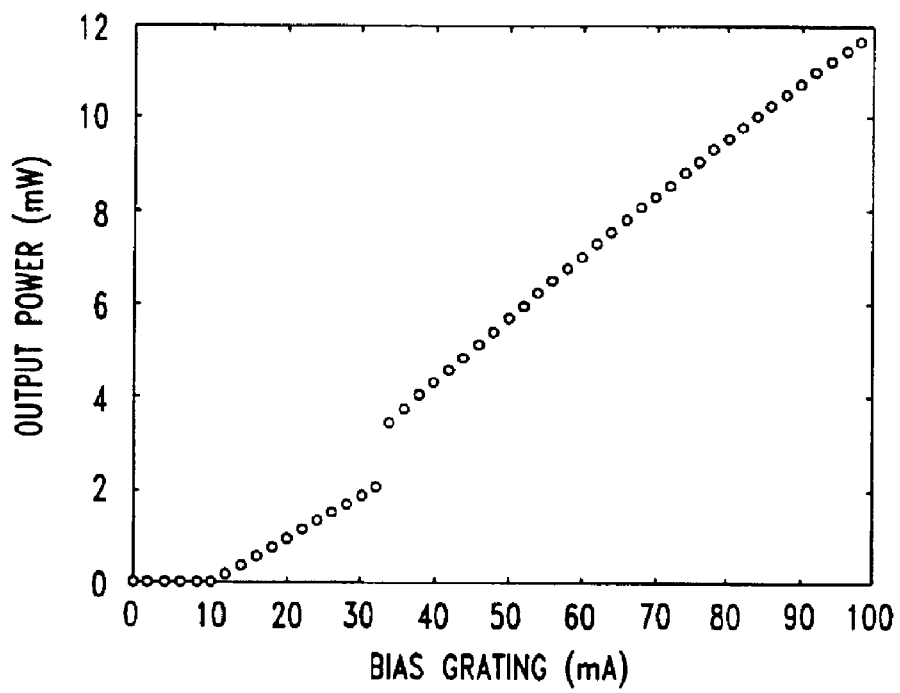
FIGS. 3A and 3B show the benefits of the multimode operation of the system of the invention.
Figure 3B:
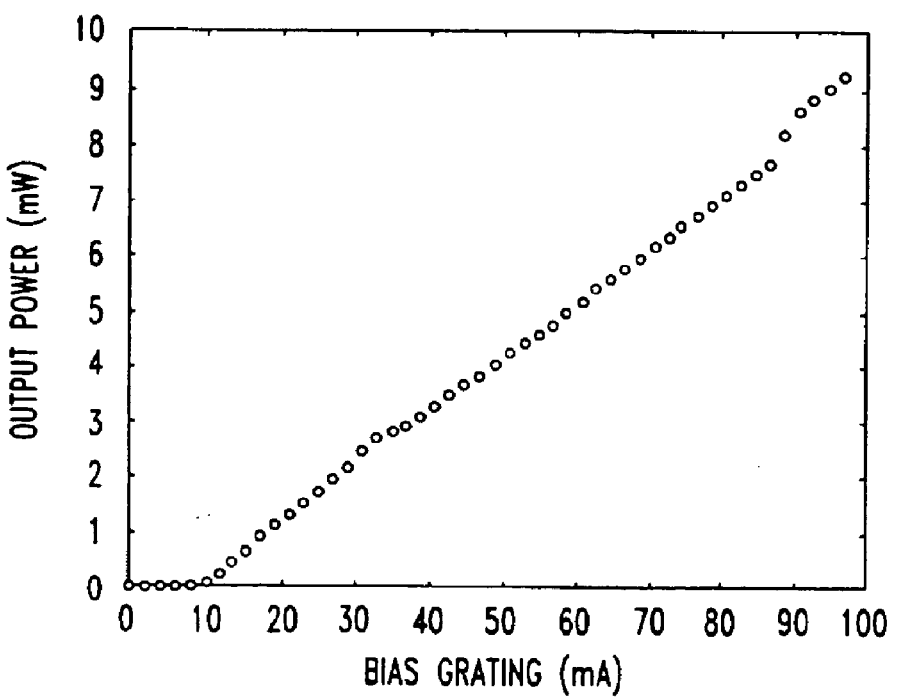

A modeling experiment was done for two external cavity lasers—one having a grating with a bandwidth of 23 GHz and a second having a grating with a bandwidth of 90 GHz. Both gratings were nominally centered at 1310 nm. FIG. 3A shows a power vs. current plot of the single mode operation of the first modeled laser. The discontinuity due to a mode hop is apparent, and such a discontinuity would introduce significant bit errors in such devices. FIG. 3B shows the power vs. current plot for the second, multimode device, which has a much smoother curve indicative of a more robust, temperature-intensive device.

EXAMPLE 2

Figure 4:
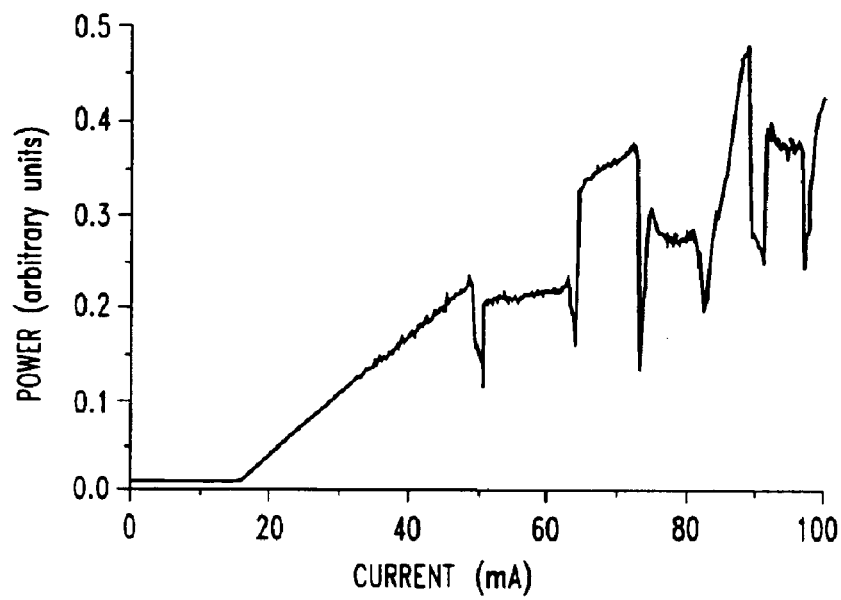
FIG. 4 shows the desirable wavelength selectivity of an external cavity laser of the system of the invention.

An external cavity laser was configured for multimode operation by use of a Bragg grating having a FWHM of 90 GHz, again with the Bragg grating centered at a wavelength of 1310 nm. FIG. 4 shows the power vs. current plot for the device at 33° C. The relatively smooth transition from mode to mode, relative to what would be expected for single mode operation, is shown.

Figure 5:
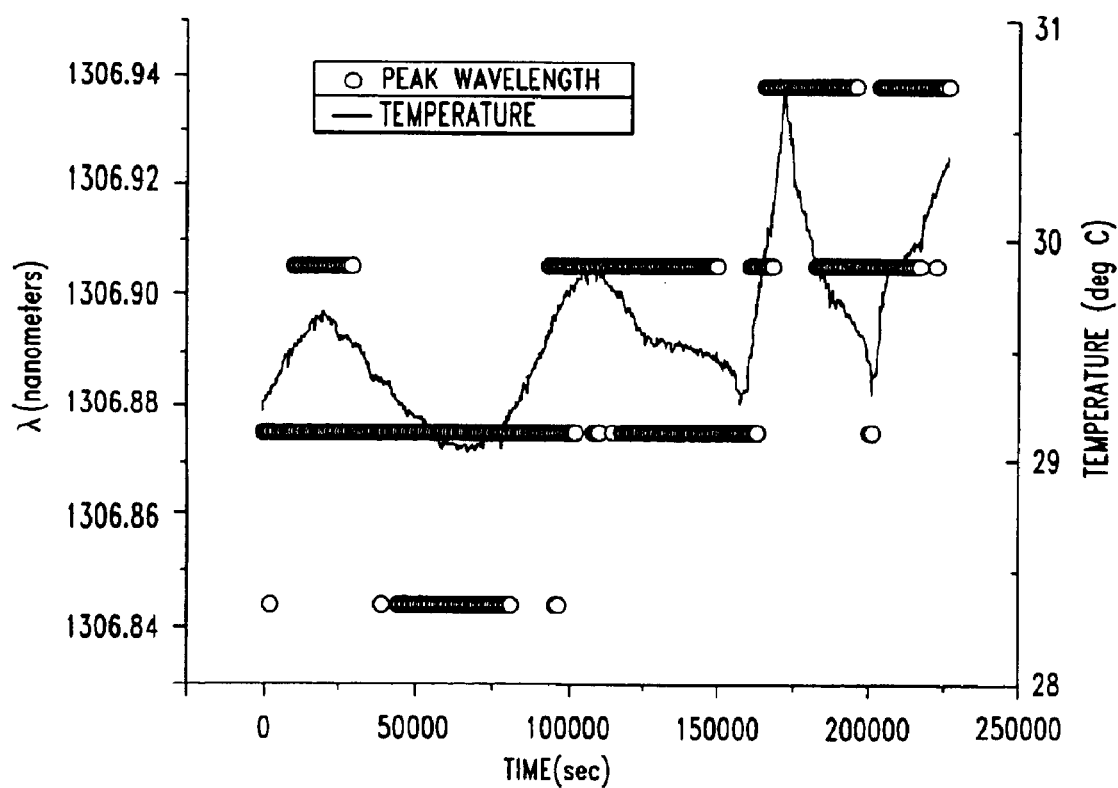
FIG. 5 shows the mode-hopping that occurs in an embodiment of the invention.

FIG. 5 shows the mode hops as a function of temperature and time. Specifically, as the temperature varied with time, the operative modes shifted while maintaining the multimode operation.

EXAMPLE 3

Figure 6:
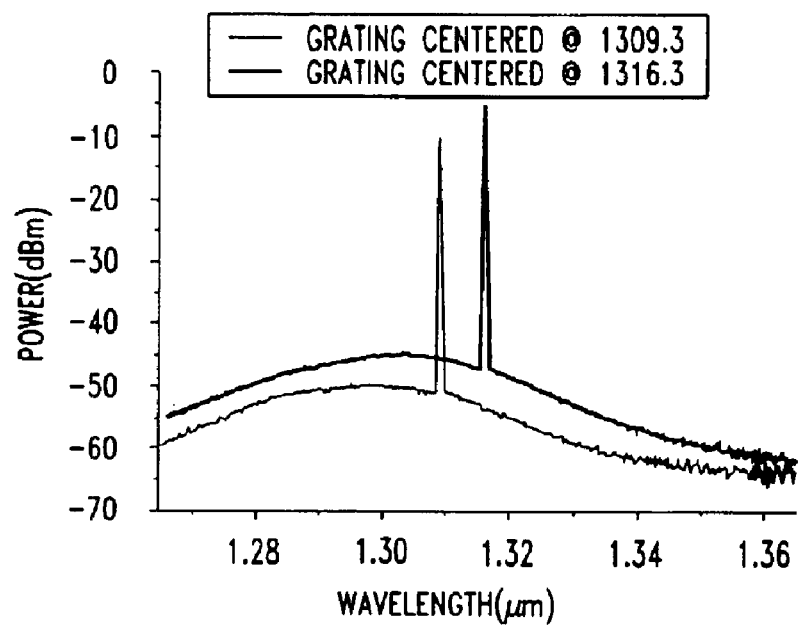
FIG. 6 shows the output of two embodiments of the invention.

Two external cavity lasers were configured for multimode operation, by use of a Bragg grating having a FWHM of 90 GHz. The first had a Bragg grating centered at a wavelength of 1309.3 with a $\Delta\lambda$ of 0.325 nm, and the second had a Bragg grating centered at a wavelength of 1316.3 with a $\Delta\lambda$ of 0.438 nm. Each device emitted about 3 modes. FIG. 6 shows the output of both devices when the gain medium was modulated at about 2.5 GHz at ambient temperature. The desirable suppression of non-desired Fabry-Perot modes is apparent.

EXAMPLE 4

Figure 7A:
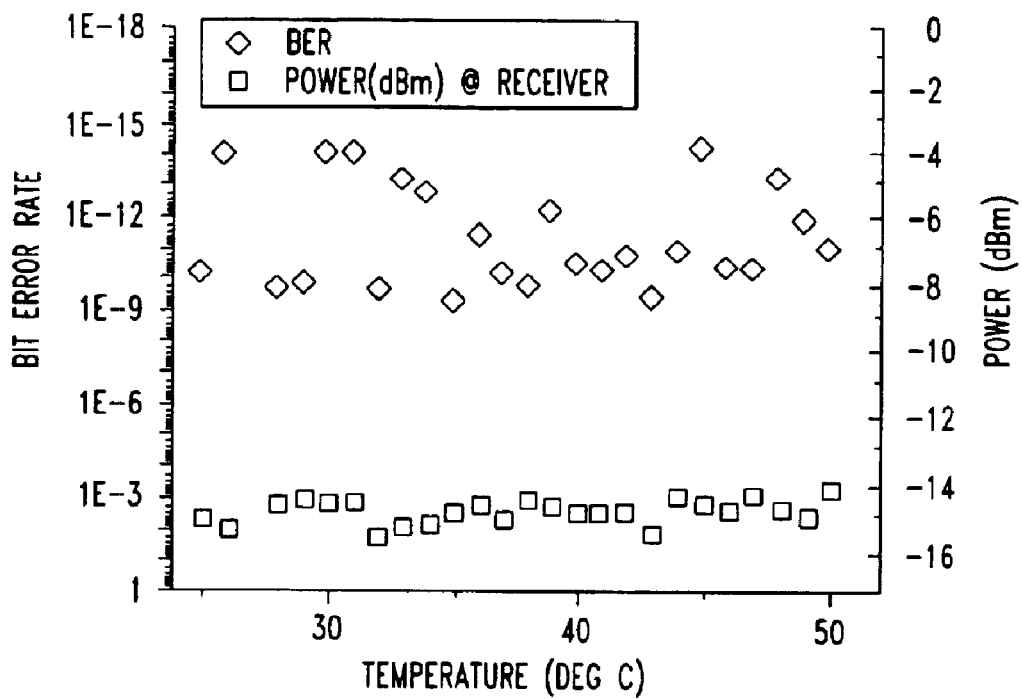
FIGS. 7A and 7B show the bit error rate provided by an embodiment of the invention, as a function of temperature.
Figure 7B:
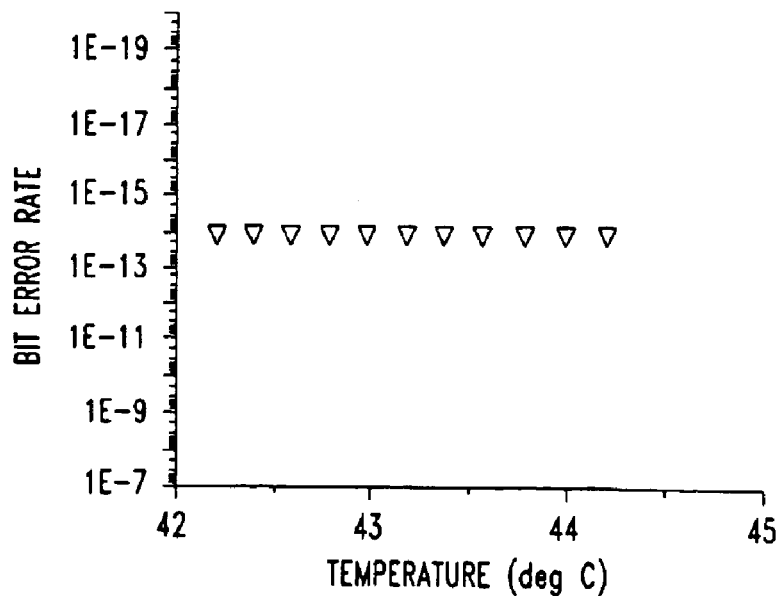

An experiment to determine the temperature sensitivity of a device of the invention, by monitoring bit error rate, was performed. The laser device was identical to that used in Example 2. High speed operation up to about 2.5 GHz was characterized by an Anritsu MP1662A digital data analyzer. The laser device was mounted on a thermal electric cooler, and the bit error rate (BER) through 32 km of fiber was measured as a function of temperature, using the cooler to make the desired temperature changes. The bias current was adjusted to maintain substantially constant power at the receiver for each temperature at which the BER was measured. The results are shown in FIG. 7A. FIG. 7B shows the same measurement, but over a smaller temperature scale. As can be seen from FIG. 7B, temperature variations of a few degrees had substantially no effect on BER. Note that this experiment reflects a worse-case measurement, given that only the chip was heated, while the remainder of the device remained at room temperature.

Figure 8:
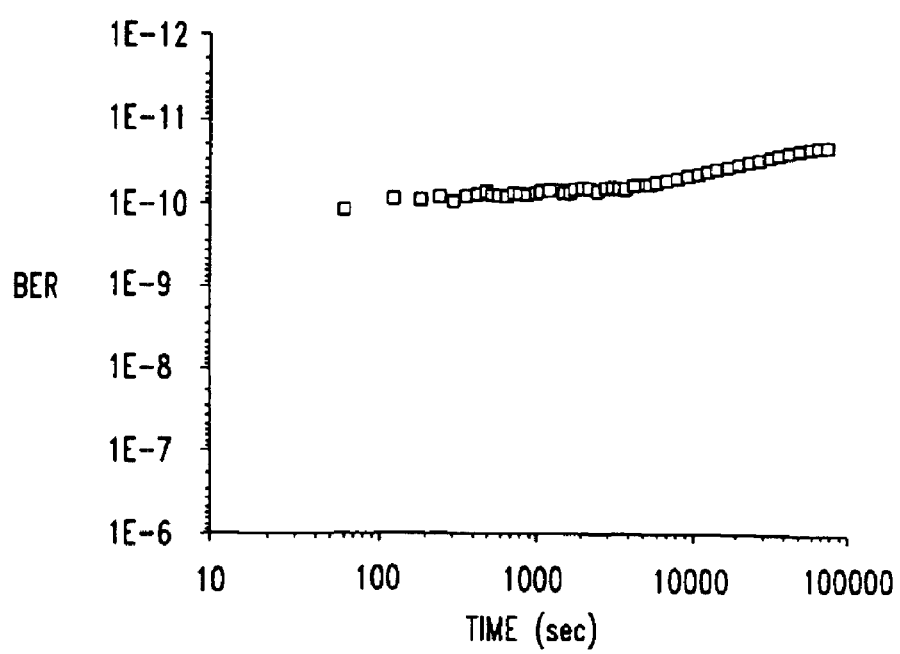
FIG. 8 shows the bit error rate under typical temperature variations in an embodiment of the invention.

FIG. 8 shows the BER during operation of the laser in an uncooled mode, i.e., with no applied temperature changes, over several days through 32 km of fiber, with the laser being run at about 2.5 GHz. It is apparent that the room temperature variations had very little effect on BER.

Other embodiments of the invention will be apparent to those skilled in the art from consideration of the specification and practice of the invention disclosed herein.

What is claimed is:

1. An optical communication system comprising an external cavity laser that comprises:

a gain medium comprising an active region, the gain medium including an antireflective layer to prevent the laser from lasing off facets of the laser, the active region containing a quantum well to generate light, the quantum well having sides and cladding layers formed on the sides;

a tapered beam expanding region, optically coupled to the active region, the beam expanding region and being wider than the active region, the beam expanding region shaped to provide lateral broadening and vertical broadening or both;

one or more optical guiding layers to guide light from the gain media towards the beam expanding region;

an optical waveguide located adjacent the gain medium such that at least a portion of the electromagnetic energy generated by the active region passes through the beam expanding region and through the antireflective layer into the optical waveguide;

a Bragg grating integral with or coupled to the optical waveguide, wherein the gain medium and the optical waveguide exhibit a coupling efficiency which even without the presence of coupling optics located between the gain medium and the optical waveguide is great enough that during laser operation, substantially all optical resonance that occurs is resonance of the cavity defined between said reflective face and said grating; and wherein the grating bandwidth is selected such that the laser provides multimode output of at least two modes within the grating bandwidth.

2. The system of claim 1, wherein the coupling efficiency is at least 50% with or without the presence of coupling optics located between the gain medium and the optical waveguide.

3. The system of claim 1, wherein the cavity has a length of less than 1 cm.

4. The system of claim 1, wherein the length of the system is less than 100 km.

5. The system of claim 1, wherein the laser is operated by direct modulation.

6. The system of claim 1, wherein the laser is operated at 2.5 GHz or greater.

7. The system of claim 1, wherein the laser is operated in the absence of a temperature-compensating apparatus.

8. The system of claim 1, wherein the gain medium and optical waveguide are coupled in the absence of coupling optics.

9. The system of claim 1, wherein the coupling efficiency between the gain medium and the optical waveguide is at least 40%.

10. The system of claim 1, wherein the bit error rate of the system is less than $10^{-9}$.

11. The system of claim 10, wherein the bit error rate of the system is less than $10^{-12}$.

12. The system of claim 1, wherein the optical communications system comprises a WDM or DWDM system.

13. The multimode laser of claim 12, wherein the light output from the gain region is butt-coupled from the AR layer to a cleaved end of said optical waveguide.

14. The multimode laser of claim 12, wherein the light output from the gain region is modulated by direct modulation.

15. An optical communication system comprising an external cavity laser that comprises:
- a gain medium comprising an active region, the gain medium including an antireflective layer to prevent the laser from lasing off facets of the laser, the active region containing a quantum well that generates light, the quantum well having sides, and two cladding layers formed on the sides of the quantum well;
- a tapered beam expanding region, optically coupled to the active region, the beam expanding region and being wider than the active region, the beam expanding region shaped to provide lateral broadening and vertical broadening or both;
- one or more optical guiding layers to guide light from the gain media towards the beam expanding region;
- an optical waveguide located adjacent the gain medium such that at least a portion of the electromagnetic energy generated by the active region passes through the beam expanding region and through the antireflective layer into the optical waveguide;
- a Bragg grating integral with or coupled to the optical waveguide,
- wherein the gain medium and the optical waveguide exhibit a coupling efficiency which even without the presence of coupling optics located between the gain medium and the optical waveguide is great enough that during laser operation, substantially all optical resonance that occurs is resonance of the cavity defined between said reflective face and said grating; and
- wherein the grating bandwidth is selected such that laser provides multimode output of at least two modes within the grating bandwidth,
- wherein the laser is operated by direct modulation,
- wherein the laser is operated in the absence of a temperature-compensating apparatus,
- wherein the gain medium comprises a cavity less than 1 cm in length,
- wherein the grating bandwidth is about 90 GHz or greater, and
- wherein the length of the system is less than 100 km.

16. The system of claim 15, wherein the coupling efficiency is at least 50%.

17. The system of claim 15, wherein the coupling efficiency between the gain medium and the optical waveguide is at least 40%.

18. The system of claim 15, wherein the optical communications system is a WDM or DWDM system.

19. The system of claim 15, wherein the bit error rate of the system is less than $10^{-9}$.

20. The system of claim 19, wherein the bit error rate of the system is less than $10^{-12}$.

21. The system of claim 19, wherein the laser is operated at 2.5 GHz or greater.

* * * * *